(12) United States Patent
Arai et al.

(10) Patent No.: US 7,633,145 B2
(45) Date of Patent: Dec. 15, 2009

(54) SEMICONDUCTOR DEVICE WITH ANTENNA AND SEPARATING LAYER

(75) Inventors: Yasuyuki Arai, Atsugi (JP); Mai Akiba, Isehara (JP); Yuko Tachimura, Atsugi (JP); Yohei Kanno, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 388 days.

(21) Appl. No.: 10/586,339

(22) PCT Filed: Jan. 11, 2005

(86) PCT No.: PCT/JP2005/000445

§ 371 (c)(1),
(2), (4) Date: Jul. 14, 2006

(87) PCT Pub. No.: WO2005/069204

PCT Pub. Date: Jul. 28, 2005

(65) Prior Publication Data

US 2007/0164413 A1    Jul. 19, 2007

(30) Foreign Application Priority Data

Jan. 16, 2004    (JP) .............................. 2004-008752

(51) Int. Cl.
*H01L 23/02*    (2006.01)
(52) U.S. Cl. .............................. 257/679; 257/E21.174; 340/572.7; 340/572.8; 343/718; 438/149
(58) Field of Classification Search ................ 257/679, 257/E21.174; 340/572.7, 572.8; 438/149
See application file for complete search history.

(56) References Cited

U.S. PATENT DOCUMENTS 6,459,588 B1 * 10/2002 Morizumi et al. ........... 361/737
6,509,217 B1 *  1/2003 Reddy ........................ 438/153

(Continued)

FOREIGN PATENT DOCUMENTS

EP    1 505 537    2/2005

(Continued)

OTHER PUBLICATIONS

International Search Report (Application No. PCT/JP2005/000445) dated Mar. 22, 2005.
Written Opinion (Application No. PCT/JP2005/000445) dated Mar. 22, 2005.

*Primary Examiner*—Wael Fahmy
*Assistant Examiner*—John C Ingham
(74) *Attorney, Agent, or Firm*—Eric J. Robinson; Robinson Intellectual Property Law Office, P.C.

(57) ABSTRACT

The invention provides a semiconductor device which can reliably restrict transmission/reception of signals or a power source voltage between a reader/writer when peeled off after stuck to an object. The semiconductor device of the invention includes an integrated circuit and an antenna formed on a support base. In the semiconductor device of the invention, a separating layer which is overlapped with the integrated circuit and the antenna sandwiching an insulating film is formed on the support base. A wiring for electrically connecting the integrated circuit and the antenna, a wiring for electrically connecting semiconductor elements in an integrated circuit, or a wiring which forms the antenna passes through the separating layer.

15 Claims, 12 Drawing Sheets

U.S. PATENT DOCUMENTS

| | | |
|---|---|---|
| 6,888,509 B2 * | 5/2005 | Atherton .................... 343/718 |
| 2003/0030689 A1 | 2/2003 | Hashimoto et al. |
| 2004/0130020 A1 * | 7/2004 | Kuwabara et al. ........... 257/723 |

FOREIGN PATENT DOCUMENTS

| | | |
|---|---|---|
| JP | 2000-020665 | 1/2000 |
| JP | 2001-013874 | 1/2001 |
| JP | 2001-014442 | 1/2001 |
| JP | 2001-109866 | 4/2001 |
| JP | 2003-123047 | 4/2003 |
| JP | 2003-318133 | 11/2003 |
| JP | 2003-331248 | 11/2003 |

* cited by examiner

SEMICONDUCTOR DEVICE WITH ANTENNA AND SEPARATING LAYER

TECHNICAL FIELD

The present invention relates to a semiconductor device which is capable of wireless communication formed on a support base.

BACKGROUND ART

A semiconductor device represented by an ID tag which is capable of transmitting and receiving data such as identification data by wireless has been advanced for practical application and the market is expected to increase as a new mode of a communication data terminal. An ID tag is also referred to as a wireless tag, an RFID (Radio Frequency Identification) tag, or an IC tag. Most ID tags which are now in practical use each has an antenna and an integrated circuit (IC chip) formed by using a semiconductor substrate.

An ID tag, being different than a magnetic card, a barcode and the like of which data can be read similarly by wireless, is superior in that stored data cannot be read physically and is not easily tampered. Moreover, an ID tag is advantageous in that it is not easily forged since relatively large scale of production equipment is required for manufacture unlike the magnetic card, the barcode and the like.

The Japanese Patent Application Laid-Open No. 2001-13874 (Patent Document 1) describes an ID label having an advantage in that it is not easily forged. An antenna of the ID label described in the Patent Document 1 is cut off when the ID label is peeled off an object being stuck. Therefore, the ID label can be used as a seal so it can be reliably detected that it is peeled off.

DISCLOSURE OF INVENTION

An ID label described in the Patent Document 1 uses a strong adhesive and a weak adhesive appropriately so that an antenna is cut off into a material sheet side and an object side. According to the aforementioned structure, however, only a portion of a film which forms the antenna is peeled off depending on the way of peeling the ID label, therefore, there may be a case where the antenna is not cut off. In such a case, in particular, only a portion of a metal film which forms an antenna is peeled off even when the antenna is to be cut off by separately using strong and week adhesives, therefore, the antenna is not always cut off for sure. Accordingly, there is also a case where the antenna functions normally and signals and a power source voltage are transmitted and received normally between the ID label and a reader/writer even after peeling the ID label off.

An ID tag is also assumed to be stuck to a flexible material such as paper and plastic, however, the mechanical strength of a semiconductor substrate is low as compared to the aforementioned materials. By shrinking the area of an ID tag itself, the mechanical strength can be enhanced to some extent, however, it is difficult to secure circuit scale and transmission gain of the antenna in this case. In particular, low transmission gain of the antenna requires a communication distance to be short, which limits the application range of the ID tag. Therefore, the circuit scale and the transmission gain of the antenna of an IC chip being emphasized, the area of an ID tag cannot be easily shrunken and the mechanical strength cannot be enhanced much.

In the case of an IC chip formed by using a semiconductor substrate, the semiconductor substrate functions as a conductor to block radio waves, therefore, there is also a problem that signals are likely to be attenuated depending on the direction of transmitted radio waves.

In view of the aforementioned problems, the invention provides a semiconductor device which can restrict transmission/reception of signals or a power source voltage to/from a reader/writer when peeled off after being stuck to an object. Moreover, the invention provides a semiconductor device of which cost can be suppressed, mechanical strength can be enhanced, and which can be formed by a simpler process, and can prevent radio waves to be blocked.

The semiconductor device of the invention has an integrated circuit and an antenna formed on a support base. Further, the semiconductor device of the invention has a separating layer which is overlapped with the integrated circuit and the antenna sandwiching an insulating film and is formed on the support base. A wiring for electrically connecting the integrated circuit and the antenna, a wiring for electrically connecting semiconductor elements in the integrated circuit, or a wiring which forms the antenna passes through the separating layer. By peeling the semiconductor device having the aforementioned structure off the object physically, the separating layer is separated, thus the semiconductor device is torn off on the border of the separating layer. Accordingly, the wiring for electrically connecting the integrated circuit and the antenna, the wiring for electrically connecting semiconductor elements in the integrated circuit, or the wiring which forms the antenna can be cut off. The semiconductor device of the invention is, representatively, an ID tag, an ID card, an ID chip, a wireless chip and the like. However, the invention is not limited to these and various application modes are possible.

A film containing metal oxide (a metal oxide film) can be used as the separating layer.

For example, by cutting the wiring for electrically connecting the integrated circuit and the antenna, the antenna and the integrated circuit can be electrically separated. Also, by cutting the wiring for electrically connecting the semiconductor elements in the integrated circuit, a function of the integrated circuit can be broken. By cutting the wiring which forms the antenna, a function of the antenna can be broken. In either case, cutting the wiring can restrict transmission/reception of signals or a power source voltage between the semiconductor device and the reader/writer reliably.

According to the invention, an integrated circuit (hereinafter referred to as a thin film integrated circuit) formed of a TFT (thin film transistor) having a thin film semiconductor which is insulated is used for a semiconductor device. A thin film integrated circuit and an antenna of the semiconductor device are formed on a flexible support base such as plastic and paper. By the antenna, transmission/reception of signals between the reader/writer and the thin film integrated circuit or a supply of a power source voltage from the reader/writer to the thin film integrated circuit can be performed.

By adhering thin film integrated circuits which are manufactured independently to be laminated, circuit scale or storage of a memory may be increased. The thin film integrated circuit is considerably thinner than an IC chip manufactured by a semiconductor substrate, therefore, mechanical strength of a semiconductor device can be maintained to some extent even when a plurality of the thin film integrated circuits are laminated. The laminated thin film integrated circuits may be connected to each other by a known connecting method such as a flip-chip method, a TAB (Tape Automated Bonding) method, and a wire bonding method.

According to the invention, unlike the aforementioned Patent Document 1, it is unlikely that only a portion of an antenna is peeled off when peeling a semiconductor device off an object. Therefore, an electrical separation between the antenna and the thin film integrated circuit can be performed reliably. Accordingly, by peeling the semiconductor device off the object, transmission/reception of signals or a power source voltage between the semiconductor device and a reader/writer can be restricted reliably.

According to the semiconductor device of the invention, a thin film integrated circuit is formed by using a TFT which is insulated. Therefore, a parasitic diode is unlikely to be formed between a substrate and the TFT, which is different than a transistor formed on a semiconductor substrate. Therefore, a large amount of current does not flow into a drain region according to a potential of an alternate signal applied to a source region or the drain region, thus deterioration or destruction is unlikely to occur.

By forming the semiconductor device by using a flexible support base, the semiconductor device can be formed into a shape suitable for a shape of an object, which can considerably increase the application range of the semiconductor device.

According to the semiconductor device of the invention, high mechanical strength can be obtained even without shrinking an area thereof as small as a conventional semiconductor device using a semiconductor substrate. Accordingly, it is easier to secure transmission gain of an antenna, and obtain a long communication distance, thus the application range of the semiconductor device can be further wider.

The frequency of radio waves used for the semiconductor device typified by an ID tag is generally 13.56 MHz or 2.45 GHz. It is essential for enhancing versatility to form the semiconductor device so that radio waves of these frequencies can be detected.

The semiconductor device of the invention is advantageous in that radio waves are not easily blocked in the thin film integrated circuit as compared to an IC chip formed by using a semiconductor substrate and that it can be prevented that signals are attenuated by the blocked radio waves. Therefore, the diameter of an antenna can be suppressed as compared to the case of the IC chip.

The cost of the semiconductor device can be drastically low by virtue of not requiring a semiconductor substrate. For example, the case of using a silicon substrate having a diameter of 12 inches and the case of using a glass substrate having a size of 7,300×9,200 $mm^2$ are compared. The area of the former silicon substrate is about 73,000 $mm^2$ while the area of the latter glass substrate is about 672,000 $mm^2$, that is, the glass substrate is about 9.2 times as large as the silicon substrate. Using the latter glass substrate having an area of about 672,000 $mm^2$, an ID tag of which one side is 1 mm can be formed about 672,000 pieces when an area consumed for separating the substrate is ignored. This number corresponds to about 9.2 times as large as that of the silicon substrate. As the case of using the glass substrate of 7,300×9,200 $mm^2$ requires less number of manufacturing steps than the case of using the silicon substrate of which diameter is 12 inches, only a third of equipment investment is required for the mass production of ID tags. Moreover, the glass substrate can be reutilized after peeling the thin film integrated circuits off. Therefore, the case of using the glass substrate requires considerably less cost than the case of using the silicon substrate even when the cost required for compensating broken glass substrates and clarifying a surface of the glass substrate is taken into account. Even when the glass substrates are abandoned without being reutilized, the cost of the glass substrate having a size of 7,300×9,200 $mm^2$ can be about a half the silicon substrate having a diameter of 12 inches, thus the cost of the semiconductor device can considerably be reduced.

Therefore, in the case of using the glass substrate having a size of 7,300 ×9,200 $mm^2$, the price of the semiconductor device can be suppressed to about one thirtieth of that of the case of using the silicon substrate having a diameter of 12 inches. As a disposable application of the semiconductor device is also expected, the ID tag of the invention of which cost can be considerably reduced is quite efficient for the aforementioned application.

BEST MODE FOR CARRYING OUT THE INVENTION

Hereinafter described with reference to drawings is an embodiment mode of the ID tag as the semiconductor device of the invention. However, the invention can be implemented in various modes. Therefore, unless such changes and modifications depart from the scope of the invention, they should be construed as being included therein. For example, the semiconductor device of the invention is not limited to the ID tag, but various application modes such as an ID card, an ID chip, and a wireless chip are possible. Thus, the invention is not limited to the specific embodiment modes.

Figure 1A:
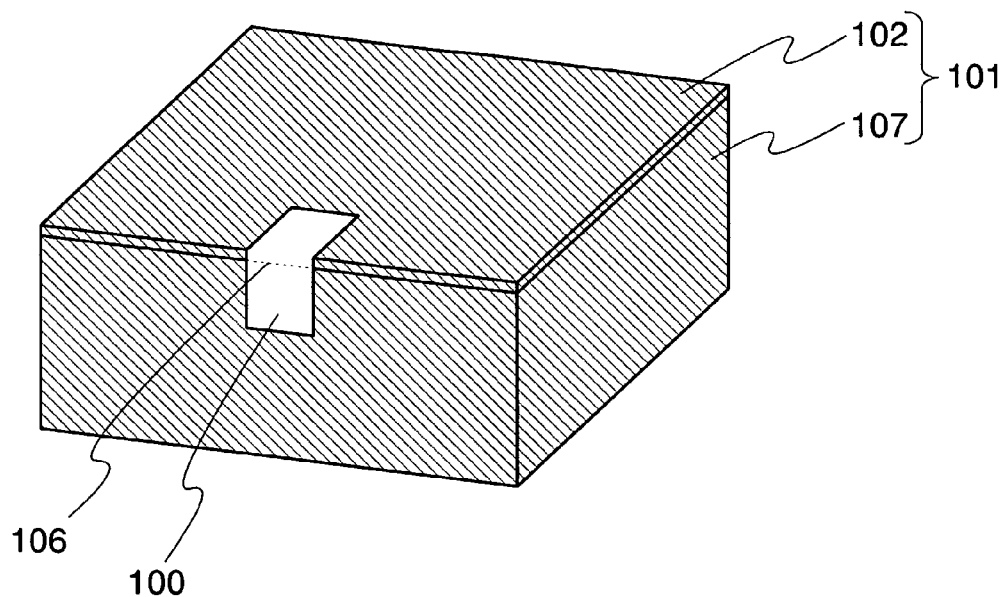
FIG. 1A is a diagram showing an ID tag 100 of the invention used for sealing a lid 102 of a container 101 and FIG. 1B is a diagram showing one mode of the ID tag 100.

FIG. 1A shows a container 101 of which a lid 102 is sealed by using an ID tag 100 of the invention. The container 101 includes the lid 102 and a main body 107. By adhering the ID tag 100 at a position so that the lid 102 of the container 101 cannot be opened unless the ID tag 100 is peeled off, it can be figured out reliably if the lid 102 is opened after the ID tag 100 is stuck. A broken line 106 denotes a border between the lid 102 and the main body 107 of the container 101.

Figure 1B:
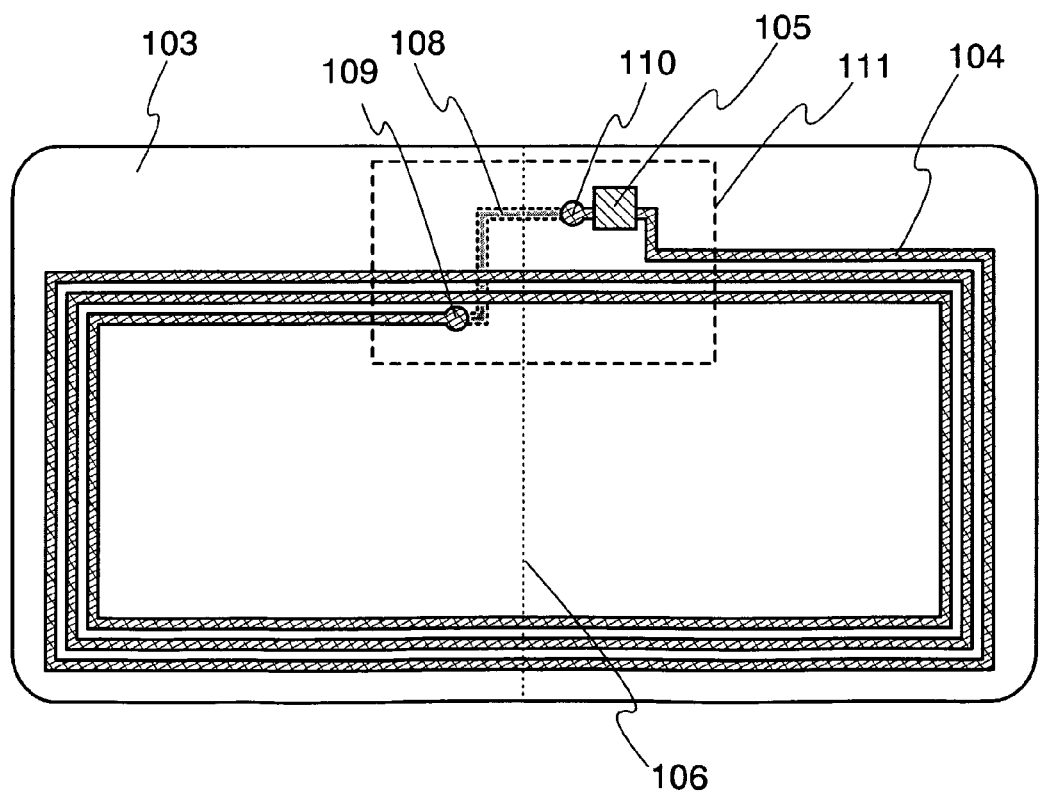

FIG. 1B shows one mode of the ID tag 100. The ID tag 100 includes a support base 103, and an antenna 104 formed, and a thin film integrated circuit 105 on the support base 103. The broken line 106 denotes a border between the lid 102 and the main body 107 of the container 101. A wiring 108 corresponds to a portion of the antenna 104, thereby terminals 109 and 110 of the antenna 104 can be electrically connected.

The thin film integrated circuit 105 can generate a power source voltage or various signals from alternate electronic signals generated in the antenna 104, and perform various operations by using the power source voltage and the various signals. Then, the alternate electronic signals generated in the thin film integrated circuit 105 are inputted to the antenna 104, thereby the various signals are transmitted from the antenna 104 to a reader/writer.

Figure 2A:
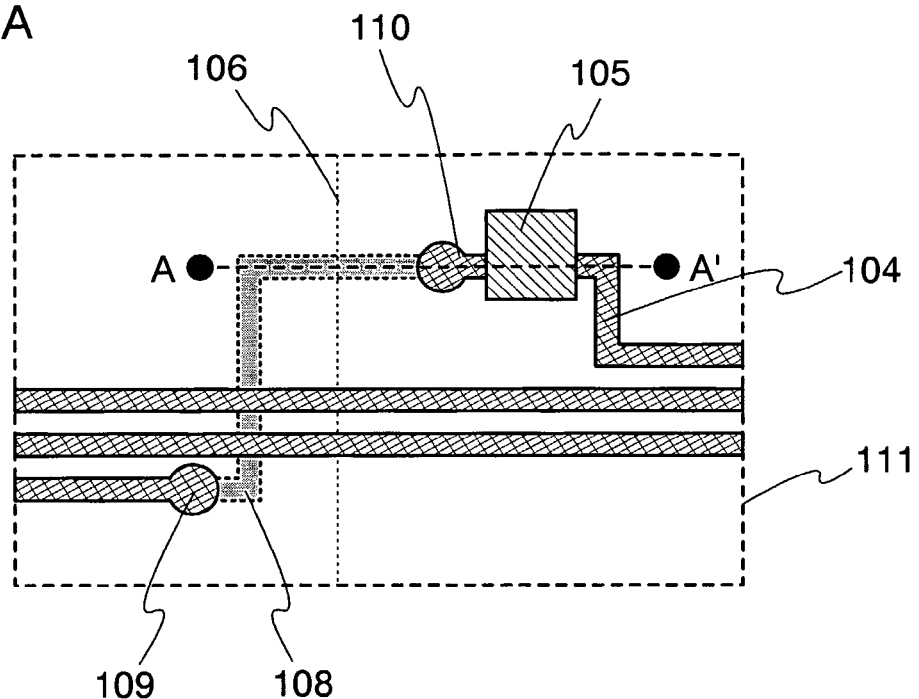
FIGS. 2A and 2B are respectively an enlarged view and a sectional view of a region surrounded by a broken line 111 of the ID tag 100 shown in FIG. 1B.
Figure 2B:
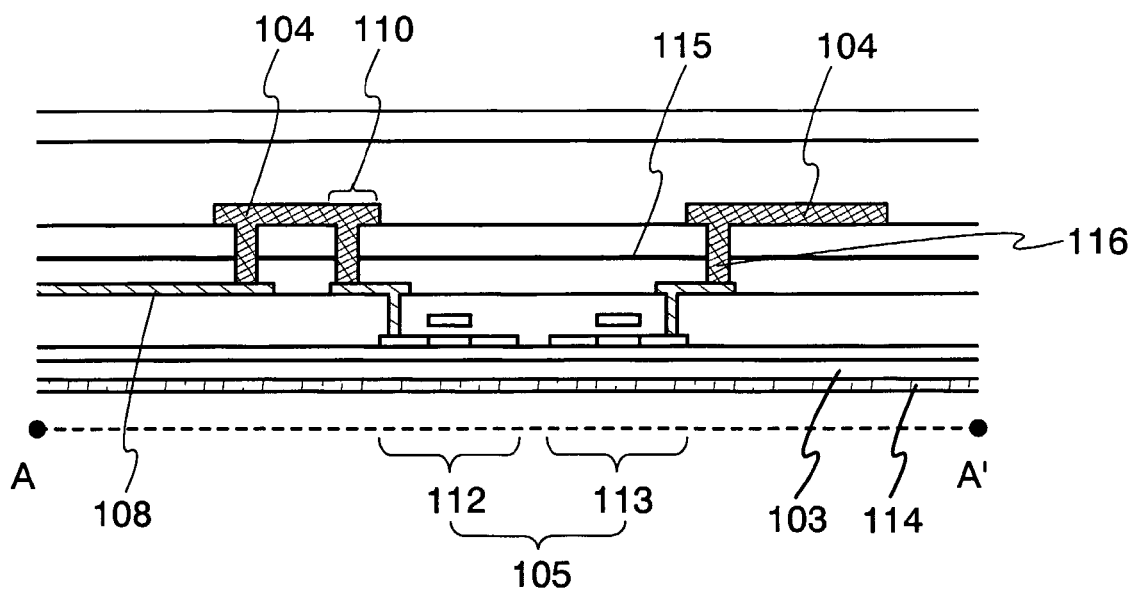

FIG. 2A shows an enlarged view of a region surrounded by a broken line 111 of the ID tag 100 shown in FIG. 1B. FIG. 2B shows a sectional view along A-A' of FIG. 2A. FIG. 2B shows a sectional view of TFTs 112 and 113 as the thin film integrated circuit 105, however, a semiconductor element included in the thin film integrated circuit 105 in the ID tag of the invention is not limited to a TFT. Other semiconductor elements than a TFT such as a memory element, a diode, a photoelectric transfer element, a resistor, a coil, a capacitor, and an inductor can be used.

An adhesive 114 is applied on the opposite surface of the support base 103 where the thin film integrated circuit 105 and the antenna 104 are formed. The adhesive 114 may be a substance that the support base 103 of the ID tag 100 can be stuck to an object. Note that a portion of the support base 103 may function as an adhesive. Alternatively, instead of applying the adhesive, an adhesive prepared separately may be used in the case of adhesion.

According to the ID tag of the invention, a separating layer 115 is formed between the antenna 104 and semiconductor elements in the thin film integrated circuit 105, which are the TFTs 112 and 113 in FIG. 2B. Note that the thin film integrated circuit 105 and the antenna 104 may be overlapped or do not have to be overlapped. A wiring 116 for electrically connecting the antenna 104 and the TFTs 112 and 113 is formed so as to pass through the separating layer 115. Note that the wiring 116 may be a portion of the antenna 104 or prepared separately.

FIG. 2B shows an example where the separating layer 115 is formed between the thin film integrated circuit 105 and the antenna 104, however, the invention is not limited to this structure. It is required that the wiring 116 for electrically connecting the antenna 104 and the thin film integrated circuit 105 is formed so as to pass through the separating layer 115. Instead, it is required that the wiring forming the antenna 104 is formed so as to pass through the separating layer 115. Alternatively, it is required that the wiring for electrically connecting semiconductor elements which form the thin film integrated circuit 105 is formed so as to pass through the separating layer 115.

Figure 3A:
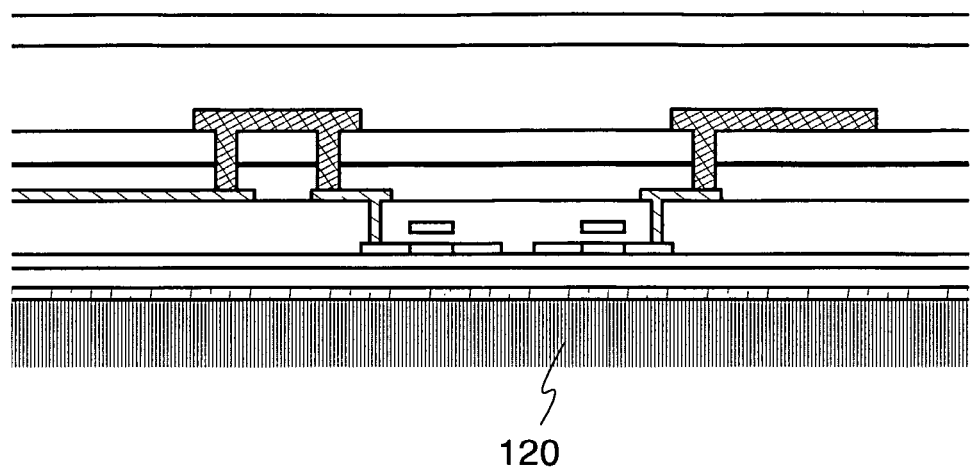
FIG. 3A is a diagram showing the ID tag shown in FIG. 2B stuck to an object 120 and FIG. 3B is a diagram showing the ID tag shown in FIG. 3A being peeled off on the border of a metal oxide film (a separating layer) 115 physically.
Figure 3B:
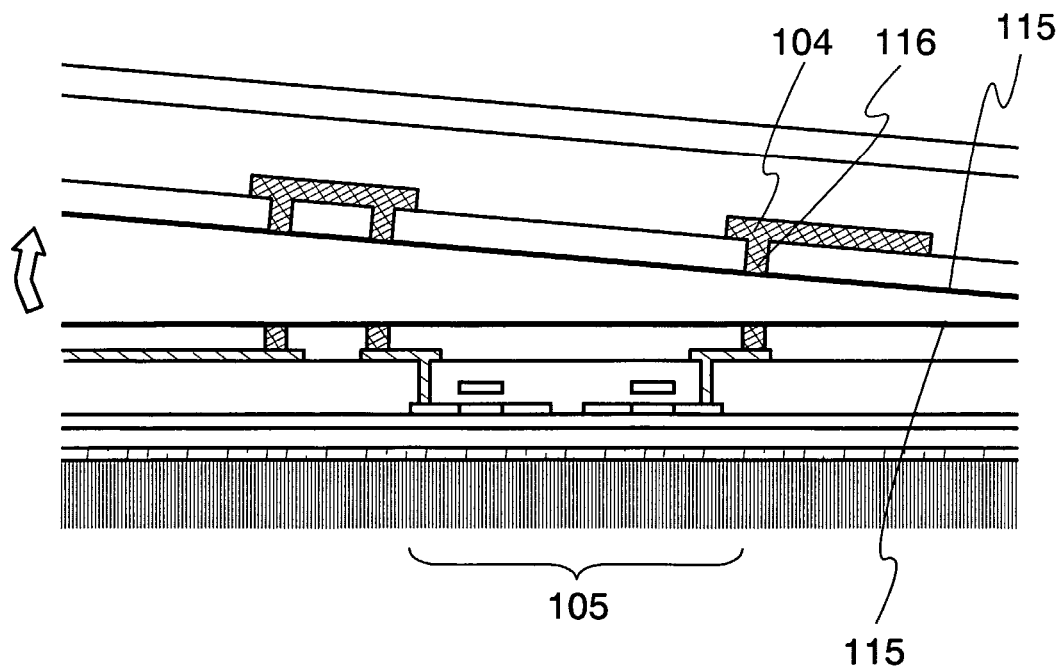

FIG. 3A shows the ID tag shown in FIG. 2B being stuck to an object 120. FIG. 3B shows the ID tag shown in FIG. 3A being peeled off physically on a border of the separating layer 115. As shown in FIG. 3B, by peeling a portion of the ID tag on the border of the separating layer 115, the wiring 116 which passes through the separating layer 115 can be cut off. Therefore, the antenna 104 and the thin film integrated circuit 105 can be electrically separated, thus transmission/reception of signals or a power source voltage between the ID tag and a reader/writer can be restricted.

In the ID tag 100 used for figuring out if the lid 102 is opened or not as shown in FIGS. 1A and 1B, a wiring which is cut off by peeling the ID tag 100 off is formed two positions at least. It is preferable that the two positions be provided sandwiching the border between the lid 102 and the main body 107 of the container 106, which is denoted by the broken line 106. According to the aforementioned structure, at least one of the wirings at two positions has to be cut for opening the lid 102, thus it can be figured out reliably if the lid 102 is opened or not.

Although the container 101 is sealed by using the ID tag 100 in FIGS. 1A and 1B, however, it may be any container as long as of which mouth can be closed.

An application of the ID tag of the invention is not limited for sealing a container. The ID tag can be used for invalidating the object or for reducing value thereof once the ID tag is peeled off. For example, the ID tag may be stuck to a tag having information of an object, such as a shipping tag, a price tag, and a nametag, or the ID tag of the invention itself may be used as a tag as it is. Also, the ID tag may be stuck to a certification corresponding to a document which proves the fact, such as a family register, a resident's card, a passport, a driver's license, an ID, a membership card, a certificate of authenticity, a credit card, a cash card, a prepaid card, a consultation ticket, and a commuter pass. Moreover, securities corresponding to a certificate which proves a juridical property right, such as a bill, a check, a claim ticket, a bill of lading, a warehouse bill, a stock, a bond, a gift certificate, and mortgage securities.

Figure 4A:
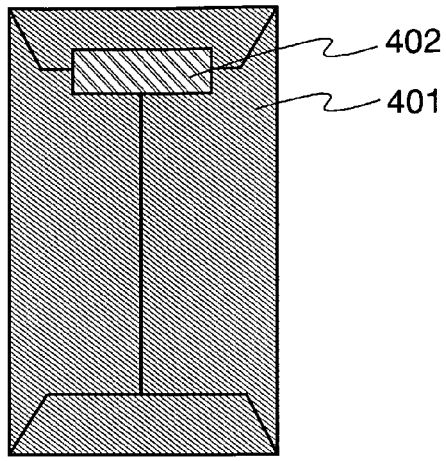
FIGS. 4A to 4C illustrate application modes of the ID tag of the invention.

FIG. 4A shows an example of using the ID tag of the invention for sealing an envelope. In FIG. 4A, by adhering an ID tag 402 of the invention, the envelope 401 is closed. According to the aforementioned structure, it can be figured out if the envelope is opened or not by a third person before an addressee opens it.

Figure 4B:
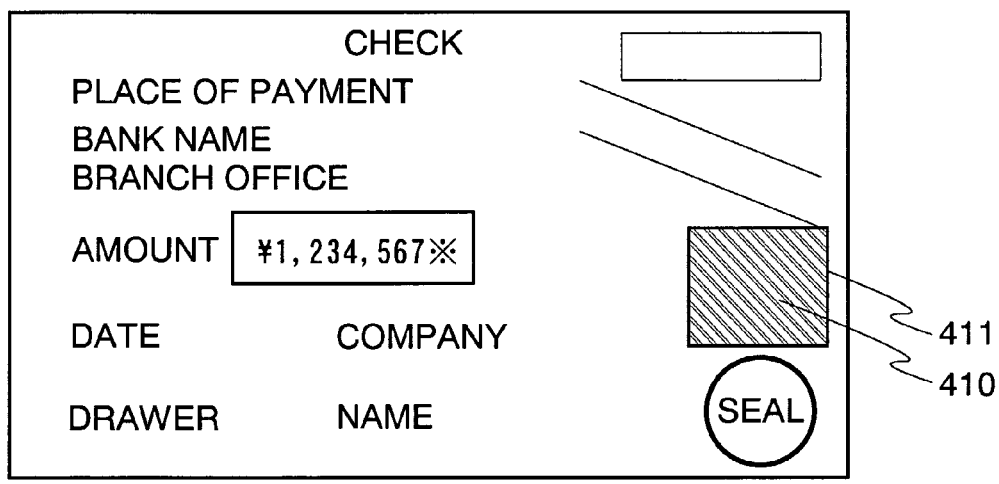

FIG. 4B shows an example of a check 411 on which an ID tag 410 of the invention is stuck. In FIG. 4B, the ID tag 410 is stuck to a surface of the check 411. According to the aforementioned structure, even when the ID tag 410 is peeled off for the purpose of forgery, for example, it can be figured out later that the ID tag 410 is peeled off, therefore the check 411 can be invalidated.

Figure 4C:
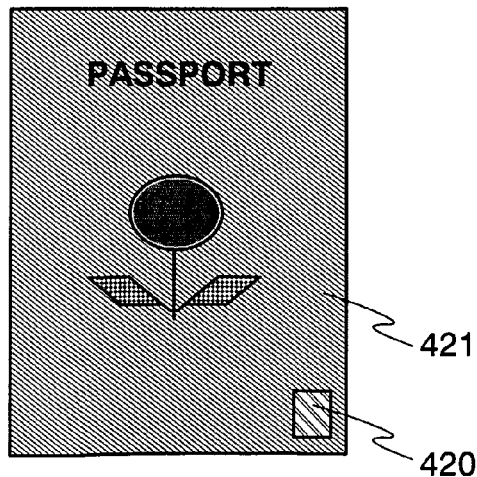

FIG. 4C shows an example of a passport 421 including an ID tag 420 of the invention. In FIG. 13A, the ID tag 420 is stuck to a cover of the passport 421, however, it may be stuck to another page of the passport 421 as well. According to the aforementioned structure, even when the ID tag 420 is peeled off for the purpose of forgery, for example, it can be figured out later that the ID 420 tag is peeled off, therefore the passport 421 can be invalidated.

Now, a manufacturing method of the semiconductor device of the invention is described. In this embodiment mode, a TFT which is insulated is shown as an example of a semiconductor element, however, the semiconductor element included in a thin film integrated circuit is not limited to this and various circuit elements can be used. For example, a memory element, a diode, a photoelectric transfer element, a resistor, a coil, a capacitor, an inductor and the like can be used as well as a TFT.

Figure 5A:
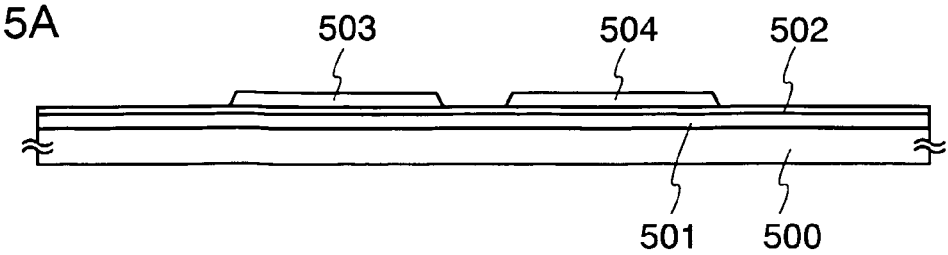
FIGS. 5A to 5E are diagrams showing manufacturing steps of the ID tag of the invention.

As shown in FIG. 5A, a separating layer 501 is formed on a substrate 500 by a sputtering method. A glass substrate such as a barium borosilicate glass or an alumino-borosilicate glass, a quartz substrate, an SUS substrate and the like that can resist processing temperature in a later manufacturing step can be used as the substrate 500.

A layer mainly containing silicon such as amorphous silicon, polycrystalline silicon, single crystalline silicon or microcrystalline silicon (including semi-amorphous silicon) can be used for the separating layer 501. The separating layer

501 can be formed by a sputtering method, a plasma CVD method or the like. In this embodiment mode, an amorphous silicon film is formed to be about 500 nm in thickness by a sputtering method, and is used as the separating layer 501.

A base film 502 is formed on the separating layer 501. The base film 502 is formed in order to prevent an alkaline metal such as Na or an alkaline earth metal contained in the support base or an adhesive from dispersing in a semiconductor film used for the semiconductor element and adversely affecting the characteristics of the semiconductor element. The base film 502 also has a function of protecting the semiconductor element from an etchant in etching the separating layer 501. The base film 502 is preferably formed of an insulating film such as silicon oxide, silicon nitride or silicon nitride oxide, which is capable of suppressing the dispersion of an alkaline metal or an alkaline earth metal into the semiconductor film and which can protect a semiconductor element from an etchant used in etching silicon. In this embodiment mode, a silicon nitride oxide film is formed to be 10 to 400 nm in thickness (preferably, 50 to 300 nm) by a plasma CVD method. The base film 502 may be a single layer or a laminated layer of insulating films.

A semiconductor film is formed on the base film 502. The semiconductor film is preferably formed without being exposed to the air after forming the base film 502. The semiconductor film is formed to have a thickness of 20 to 200 nm (preferably, 40 to 170 nm). The semiconductor film may be an amorphous semiconductor, a semi-amorphous semiconductor or a polycrystalline semiconductor. Silicon germanium as well as silicon can be used for the semiconductor. In the case of using silicon germanium, the concentration thereof is preferably approximately 0.01 to 4.5 atomic %.

The semiconductor film may be crystallized by a known method. As known methods of crystallization, a thermo-crystallization method using an electrically heated oven, a laser crystallization method using laser light, and a lamp annealing crystallization method using an infrared ray are cited. Further, a crystallization method using a catalyst element can be used. In the case of e.g., laser crystallization, before the laser crystallization, thermal annealing is performed on a semiconductor film for an hour at 500° C. to enhance the tolerance of the semiconductor film to laser light. It is possible to obtain crystals having a large grain size by emitting laser light of second to fourth harmonics of a fundamental wave with a solid-state laser that is capable of continuously oscillation. Typically, it is preferable to use second harmonic (532 nm) or third harmonic (355 nm) of an Nd:YVO$_4$ laser (fundamental wave: 1064 nm). Specifically, laser light emitted from a continuous wave type YVO$_4$ laser is converted to the harmonic with a non-linear optical element to obtain laser light with the output power of 10 W. Preferably, laser light is formed to have a rectangular shape or an elliptical shape in an irradiated surface by using an optical system to irradiate the semiconductor film with the laser light. On this occasion, an energy density of approximately 0.01 to 100 MW/cm$^2$ (preferably 0.1 to 10 MW/cm$^2$) is necessary. The scanning speed thereof is set to approximately 10 to 2000 cm/sec. to emit laser light.

The pulsed laser has a repetition rate of 10 MHz or more. This repetition rate may be extremely higher than that of the pulsed laser used usually, which is from several tens to several hundreds Hz, to conduct laser crystallization. It is said that it takes several tens to several hundreds nsec. to solidify the semiconductor film completely after the semiconductor film is irradiated with the pulsed laser light. When the pulsed laser light has a repetition rate of 10 MHz or more, it is possible to irradiate the next pulsed laser light after the semiconductor film is melted by the laser light and before the semiconductor film is solidified. Therefore, since the interface between the solid phase and the liquid phase can be moved continuously in the semiconductor film, the semiconductor film having a crystal grain grown continuously toward the scanning direction is formed. Specifically, it is possible to form an aggregation of crystal grains each of which has a width of 10 to 30 μm in the scanning direction and a width of approximately 1 to 5 μm in a direction perpendicular to the scanning direction. It is also possible to form a semiconductor film having almost no crystal grain boundaries at least in the channel direction of the TFT by forming a crystal grain of a single crystal extending long in the scanning direction.

As for the laser crystallization, continuous wave laser light of a fundamental wave and continuous wave laser light of a harmonic may be irradiated in parallel, or continuous wave laser light of a fundamental wave and pulsed laser light of a harmonic may be irradiated in parallel.

Laser light may be emitted in an inert gas atmosphere such as a rare gas or nitrogen. Thus, unevenness in a surface of a semiconductor due to the laser irradiation can be suppressed, and variation of a threshold value due to variation of the interface state density can be suppressed.

A semiconductor film having more enhanced crystallinity is formed by irradiating the semiconductor film with the laser light as described above. Note that a polycrystalline semiconductor may be formed in advance by a sputtering method, a plasma CVD method or a thermal CVD method.

The semiconductor film is crystallized in this embodiment mode, however, but an amorphous silicon film or a microcrystalline semiconductor film may be used in the next process without performing the crystallization. A TFT using an amorphous semiconductor or a microcrystalline semiconductor needs fewer manufacturing steps than a TFT using a polycrystalline semiconductor, thus, has advantages of reducing costs and enhancing yield.

A semi-amorphous semiconductor has an intermediate structure between an amorphous structure and a crystalline structure (including a single crystalline structure, and a polycrystalline structure), and a third state that is stable with respect to free energy. Such a semi-amorphous semiconductor includes a short range order and lattice distortion, and is crystalline. Crystal grains of 0.5 to 20 nm in size are contained in an amorphous semiconductor. As for the semi-amorphous semiconductor, the Raman spectrum shifts to the lower side of a wave number of 520 cm$^{-1}$, and a diffraction peak of (111) and (220) derived from a silicon crystal lattice is observed in x-ray diffraction. Further, the semi-amorphous semiconductor contains hydrogen or halogen of 1 atom % or more for terminating a dangling bond. Herein, the semi-amorphous semiconductor is referred to as an SAS for convenience. When a rare gas element such as helium, argon, krypton, or neon is mixed into an SAS, the lattice distortion is more increased and the stability is thus enhanced, thereby obtaining an excellent SAS.

Figure 5B:
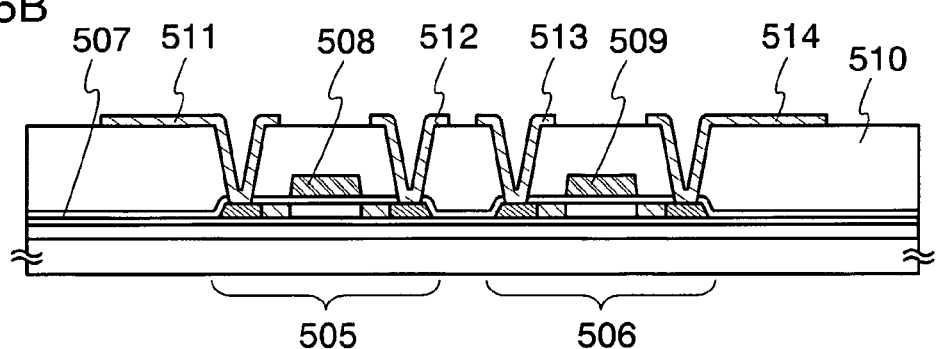

Then, as shown in FIG. 5A, the semiconductor film is patterned to form an island-like semiconductor films 503 and 504. Various semiconductor elements typified by TFTs are formed using the island-like semiconductor films 503 and 504 as shown in FIG. 5B. In FIG. 5B, the island-like semiconductor films 503 and 504 are in contact with the base film 502, but an electrode, an insulating film, or the like may be formed between the base film 502 and the island-like semiconductor films 503 and 504, depending on a semiconductor elements. For example, in the case of a bottom gate TFT that is one of the semiconductor element, a gate electrode and a gate insulating film are formed between the base film 502 and the island-like semiconductor films 503 and 504.

In FIG. 5B, top gate TFTs 505 and 506 are formed using the island-like semiconductor films 503 and 504. Specifically, a gate insulating film 507 is formed so as to cover the island-like semiconductor films 503 and 504. Then, a conductive film is formed over the gate insulating film 507 and patterned to form gate electrodes 508 and 509. Next, impurities imparting n-type conductivity are added to the island-like semiconductor films 503 and 504 by using the gate electrodes 508 and 509 or a resist that is formed and patterned as a mask to form a source region, a drain region, an LDD region and the like. Here, the TFTs 505 and 506 are n-type TFTs, but impurities imparting p-type conductivity are added in the case of using a p-type TFT. According to the above-described process, the TFTs 505 and 506 can be formed.

Moreover, heat treatment may be performed in the atmosphere including hydrogen in the range of 3 to 100% at a temperatures ranging from 300 to 450° C. for 1 to 12 hours to hydrogenate the island-like semiconductor films 503 and 504 after forming the gate insulating film 507. As another dehydrogenation method, plasma dehydrogenation (using hydrogen excited by plasma) may be conducted. In this step, the dangling bond can be terminated by the hydrogen excited thermally. In a later step, even when defects are formed in a semiconductor film by bending a support base after a semiconductor element is attached to the flexible support base, the defects can be terminated by hydrogen contained in the semiconductor film by setting the hydrogen concentration in the semiconductor film to $1 \times 10^{19}$ to $5 \times 10^{21}$ atoms/cm$^3$. Halogen may be contained in the semiconductor film to terminate the defects.

Note that a manufacturing method of a TFT is not limited to the above described one.

A first interlayer insulating film 510 is formed to cover the TFTs 505 and 506. After contact holes are formed in the gate insulating film 507 and the first interlayer insulating film 510, wirings 511 to 514 to be connected to the TFTs 505 and 506 through the contact holes are formed to be in contact with the first interlayer insulating film 510.

Figure 5C:
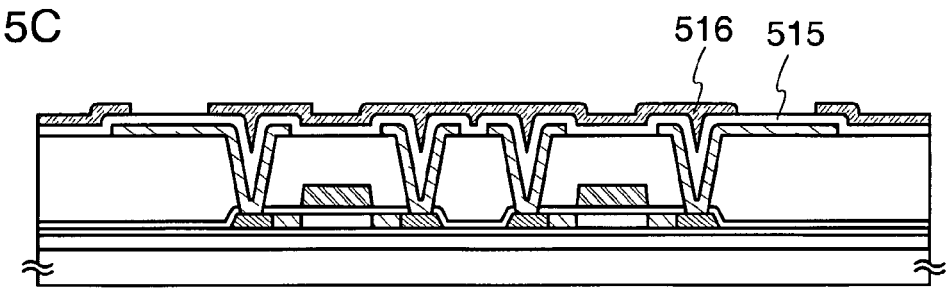

As shown in FIG. 5C, a second interlayer insulating film 515 is formed over the first interlayer insulating film 510 so as to cover the wirings 511 to 514. A metal film 516 is formed on the second interlayer insulating film 515. Here, the metal film 516 is formed of tungsten in thickness of 10 to 200 nm, preferably 50 to 75 nm. Apertures are formed in the metal film 516 in a region which is overlapped with the wirings 511 to 514 for electrically connecting to an antenna later.

Figure 5D:
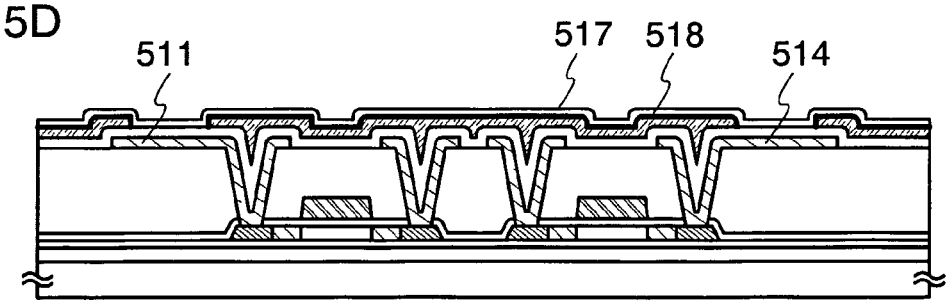

As shown in FIG. 5D, an oxide film 517 which forms an insulating film is laminated without being exposed to air after forming the metal film 516. Here, a silicon oxide film is formed in thickness of 150 to 300 nm as the oxide film 517. In the case of forming by sputtering, an oxide film is also formed on an edge portion of the substrate 500. Therefore, it is preferable that the metal film 516 and the oxide film 517 be selectively removed by $O_2$ ashing and the like so that the oxide film 517 is not left on the substrate 500 side.

When depositing the oxide film 517, pre-sputtering is performed that plasma is generated by blocking between a target and a substrate as a former stage of sputtering. The pre-sputtering is performed with flow rates of Ar and $O_2$ as 10 and 30 sccm respectively with a temperature of the substrate 500 being set at 270° C. and a deposition power being set in a parallel state at 3 kW. By the pre-sputtering, a quite thin separating layer (a metal oxide film is used in this embodiment mode) 518 having about several nm in thickness (here, 3 nm) is formed between the metal film 516 and the oxide film 517. The metal oxide film 518 can be formed by oxidizing a surface of the metal film 516. Therefore, the metal oxide film 518 is formed of tungsten oxide in FIG. 5D.

In FIG. 5D, the metal oxide film 518 is formed by pre-sputtering, however, the invention is not limited to this. For example, the metal oxide film 518 may be formed by adding oxygen or oxygen added with inert gas of Ar and the like to oxidize the surface of the metal film 516 by plasma intentionally.

For the first interlayer insulating film 510 and the second interlayer insulating film 515, an organic resin film, an inorganic insulating film, and an insulating film containing a Si—O—Si bond formed by using a siloxane material as a starting material (hereinafter referred to as a siloxane insulating film) and the like can be used. The siloxane insulating film may contain at least one of fluorine, an alkyl group, and aromatic carbon hydride as well as hydrogen for a substituent.

Subsequently, the metal oxide film 518 is crystallized by applying heat treatment. By crystallization, the metal oxide film 518 becomes easily broken on grain boundaries, thus fragility thereof can be enhanced. In this embodiment mode, tungsten oxide is used for the metal oxide film 518. In this case, it is preferable that the crystallization of the metal oxide film 518 be performed by heat treatment at a temperature of 420 to 550° C. for about 0.5 to 5 hours. In this embodiment mode, a step of heat treatment is provided only for crystallizing the metal oxide film 518, however, the invention is not limited to this. In the case where heat treatment is performed in another step later, it may substitute this crystallization of the metal oxide film 518. In this embodiment mode, the step of crystallizing the metal oxide film 518 is provided since tungsten oxide is described as an example, however, the invention is not limited to this. In the case where the metal oxide film 518 has sufficiently high fragility, the step of crystallizing the metal oxide film 518 is not necessarily provided.

Figure 5E:
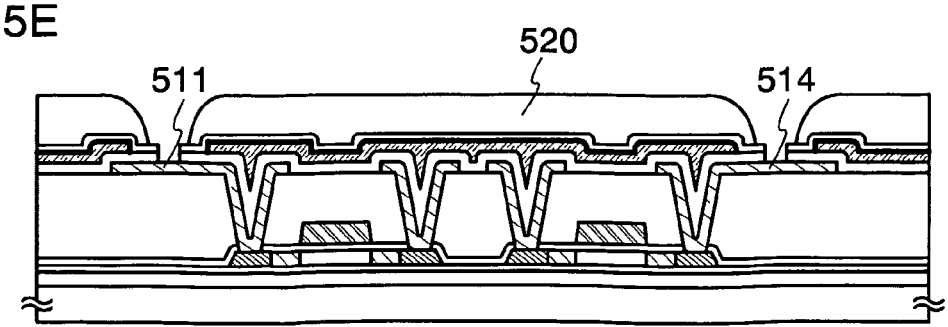

Subsequently, as shown in FIG. 5E, the second interlayer insulating film 515 and the oxide film 517 are etched through apertures of the metal film 516, thereby portions of the wirings 511 and 514 are exposed. By forming the second interlayer insulating film 515 and the oxide film 517 using the same material, the aforementioned etching step can be simplified.

Subsequently, a third interlayer insulating film 520 is formed. The third interlayer insulating film 520 can be formed of an organic resin film, an inorganic insulating film or a siloxane insulating film. The third interlayer insulating film 520 is formed so as to have apertures at a position where the wirings 511 and 514 are exposed.

Figure 6A:
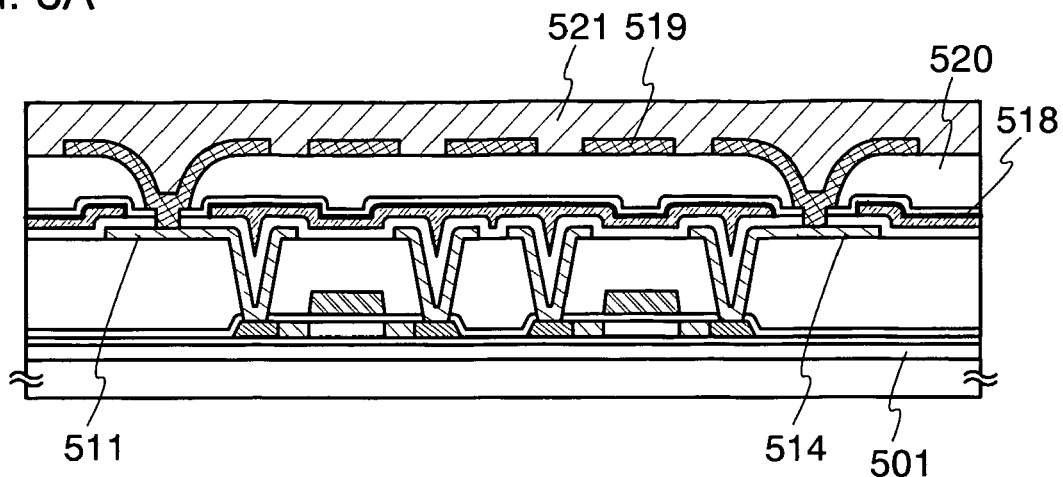
FIGS. 6A to 6C are diagrams showing manufacturing steps of the ID tag of the invention.

Next, as shown in FIG. 6A, an antenna 519 is formed on the third interlayer insulating film 520. The antenna 519 can be formed by using a conductive material containing one or a plurality of metal and metal compound of such as Ag, Au, Cu, Pd Cr, Mo, Ti, Ta, W, and Al. A portion of the antenna 519 passes through the metal oxide film 518. The antenna 519 is connected to the wirings 511 and 514. Note that the antenna 519 is directly connected to the wirings 511 and 514 in FIG. 6A, however, the ID tag of the invention is not limited to this structure. The antenna 519 and the wirings 511 and 514 may be electrically connected by using a wiring formed separately, for example.

The antenna 519 can be formed by using a printing method, a photolithography method, a vapor deposition method, a droplet discharging method and the like. In this embodiment mode, the antenna 519 is formed of a single layer conductive film, however, the antenna 519 may be formed of a lamination of a plurality of conductive films.

The droplet discharging method is a method for forming a predetermined pattern by discharging droplets containing a predetermined composition from a minute orifice, which includes an ink-jetting method. The printing method includes a screen-printing method, an offset printing method and the like. By using the printing method or the droplet discharging method, the antenna 519 can be formed without using a mask for exposure. Moreover, the droplet discharging method and the printing method do not waste a material which is removed by etching in the photolithography method. As an expensive mask for exposure is not required to be used, cost spent for manufacturing ID tags can be suppressed.

In the case of using the droplet discharging method or the printing method, conductive particles obtained by coating Cu with Ag can be used as well, for example. In the case of forming the antenna 519 using the droplet discharging method, it is preferable to apply treatment to a surface of the third interlayer insulating film 520 for enhancing adhesion property of the antenna 519.

As a method for enhancing the adhesion property, a method for applying a metal or a metal compound which can enhance the adhesion property of a conductive film or an insulating film by a catalytic activity to a surface of the third interlayer insulating film 520, a method for applying an organic insulating film which has high adhesion property with a conductive film or an insulating film to be formed to the surface of the third interlayer insulating film 520, a method for modulating a surface property by applying plasma treatment under an atmospheric pressure or a reduced pressure to the surface of the third interlayer insulating film 520. As a metal which has high adhesion property with the conductive film or the insulating film is, for example, titanium, titanium oxide, or 3d transition element such as Sc, Ti, V, Cr, Mn, Fe, Co, Ni, Cu, and Zn. As a metal compound, oxide, nitride, oxynitride and the like of the aforementioned metal are used. As the organic insulating film, polyimide, siloxane insulating film and the like are used, for example.

In the case where the metal or the metal compound applied on the third interlayer insulating film 520 is conductive, sheet resistance thereof is controlled so that the antenna can operate normally. Specifically, an average thickness of the conductive metal or the metal compound is controlled to be 1 to 10 nm or the metal or the metal compound is partially or wholly insulated by oxidization, for example. Alternatively, the applied metal or the metal compound may be selectively removed by etching except for a region which requires high adhesion property. Otherwise, the metal or the metal compound may be selectively applied only in a specific region by using the droplet discharging method, the printing method, a sol-gel process and the like instead of applying it on a whole surface of the substrate in advance. The metal or the metal compound do not have to be in a state of a completely continuous film on the surface of the third interlayer insulating film 520, but may be dispersed to some extent.

After forming the antenna 519 a protective layer 521 is formed on the third interlayer insulating film 520 so as to cover the antenna 519. The protective layer 521 is formed by using a material which can protect the antenna 519 when removing the peeling layer 501 by etching. For example, the protective layer 521 can be formed by wholly applying resin such as epoxy, acrylate, and silicon which is soluble in water or alcohols.

In this embodiment mode, aqueous resin (TOA GOSEI CO., LTD.: VL-WSH L10) is applied by spin coating in thickness of 30 μm, exposed for two minutes for temporary curing, then, its back is exposed to UV rays for 2.5 minutes, and exposed for 10 minutes to be fully cured. Consequently, the protective layer 521 is formed. In the case of laminating a plurality of organic resin, there may be a case where the stacked organic resins melt depending on the solvent during application or baking, or where the adhesion property becomes too high. Therefore, in case of forming both the third interlayer insulating film 520 and the protective layer 521 of organic resin which is soluble in the same solvent, it is preferable to form an inorganic insulating film (a $SiN_X$ film, a $SiN_XO_Y$ film, an $AlN_X$ film, or an $AlN_XO_Y$ film) so as to cover the third interlayer insulating film 520 for smoothly removing the protective film 521 in the subsequent process.

Figure 6B:
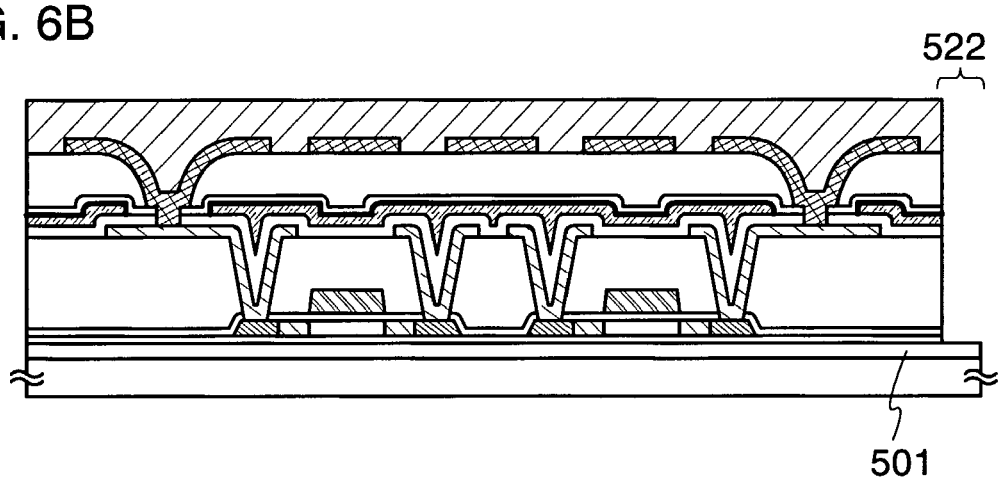

As shown in FIG. 6B, a groove 522 is formed for separating the thin film integrated circuits. The groove 522 is required to be formed to the extent that the peeling layer 501 is exposed. The groove 522 can be formed by dicing, scribing and the like. In the case where the thin film integrated circuits formed on the substrate 500 are not required to be separated, the groove 522 is not necessarily formed.

Figure 6C:
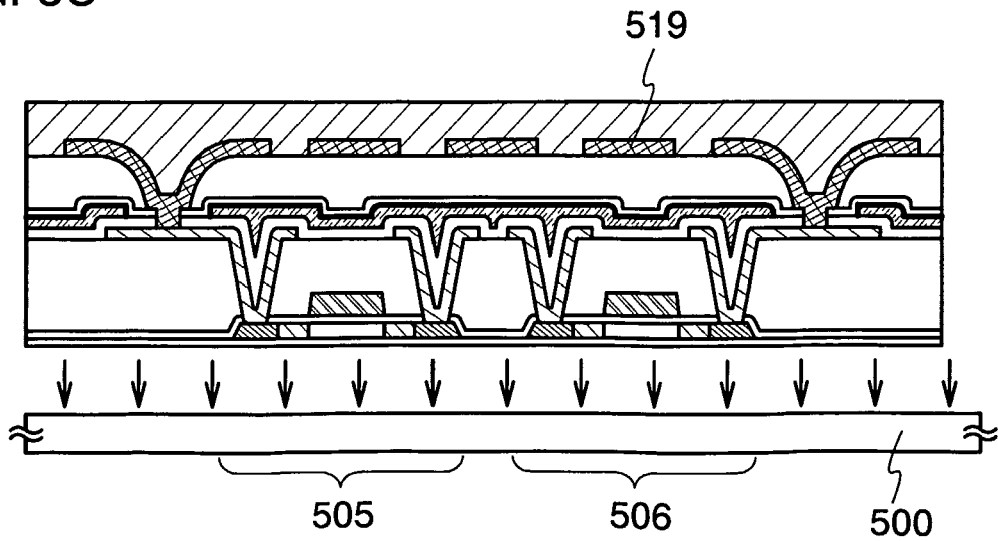

As shown in FIG. 6C, the peeling layer 501 is removed by etching. In this embodiment mode, halogenated fluorine is used as an etching as, which is brought in from the groove 522. In this embodiment mode, the etching is performed using $ClF_3$ (chlorine trifluoride) at a temperature of 350° C. with a flow rate of 300 sccm and air pressure of 6 Torr for 3 hours. A gas obtained by mixing nitrogen in $ClF_3$ gas may be used as well. By using the halogenated fluorine such as $ClF_3$, the peeling layer 501 is selectively etched and the substrate 500 can be peeled off the TFTs 505 and 506.

Note that the halogenated fluorine may be either a gas or liquid.

Figure 7:
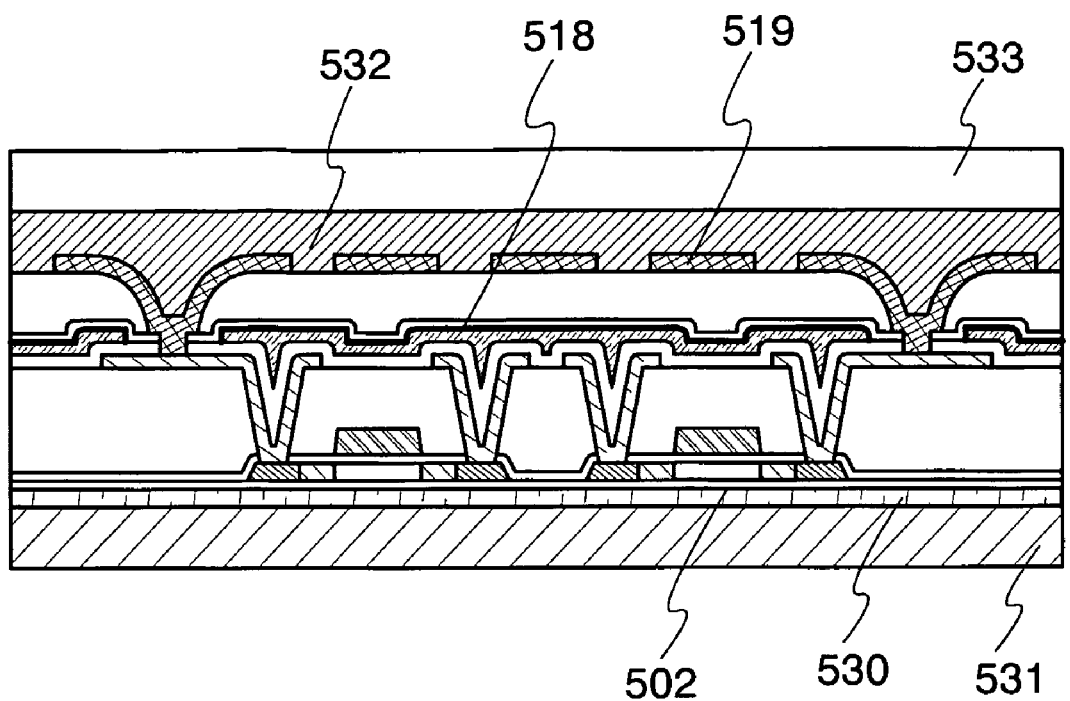
FIG. 7 is a diagram showing a manufacturing step of the ID tag of the invention.

As shown in FIG. 7, the TFTs 505 and 506 which are peeled off and the antenna 519 are stuck to the support base 531 by using an adhesive 530. A material which can stick the support base 531 and the base film 502 with each other is used for the adhesive 530. Moreover, for the adhesive 530, a material which has enough strength is used so that the support base 531 and the base film 502 are not peeled off when peeling a completed ID tag off an object after adhesion, although the ID tag may be peeled off in the metal oxide film 518. For the adhesive 530, for example, various curable adhesives such as a photo-curable adhesive such as a reactive curable adhesive, a heat curable adhesive, and an ultraviolet curable adhesive, and an anaerobic adhesive can be used.

For the support base 531, a flexible organic material such as paper and plastic can be used. Alternatively, a flexible inorganic material may also be used for the support base 531. ARTON (manufactured by JSR) formed of poly norbornene having a polar group can be used as the plastic substrate. Polyester represented by polyethylene terephthalate (PET), and polyether sulfone (PES), polyethylene naphthalate (PEN), polycarbonate (PC), nylon, polyether etherketone (PEEK), polysulfone (PSF), polyether imide (PEI), polyarylate (PAR), polycutylene terephthalate (PBT), polyimide, acrylonitrile butadiene styrene resin, poly vinyl chloride, polypropylene, poly vinyl acetate, acryl resin and the like can be used. It is preferable that the support base 531 have a high degree of heat conductivity of about 2 to 30 W/mK for dispersing the heat generated in the thin film integrated circuit.

In addition, as shown in FIG. 7, after removing the protective layer 521, the adhesive 532 is applied on the third interlayer insulating film 520 so as to cover the antenna 519, thereby a cover material 533 is stuck. The cover material 533 can be formed by using a flexible organic material such as paper and plastic similarly to the support base 531. For the adhesive 532, an organic or inorganic material which can stick the cover material 533, the third interlayer insulating film 520, and the antenna 519 are used. Moreover, for the adhesive 532, a material which has enough strength is used so that the cover material 533, the third interlayer insulating film 520, and the antenna 519 are not peeled off when peeling a completed semiconductor device off an object after adhesion, although the semiconductor device may be peeled off in the metal oxide film 518. For the adhesive 532, for example, various curable adhesives such as a photo-curable adhesive such as a reactive curable adhesive, a heat curable adhesive, and an ultraviolet curable adhesive, and an anaerobic adhesive can be used.

Through each of the aforementioned steps, the semiconductor device of the invention is completed. According to the aforementioned manufacturing method, a thin film integrated circuit having a total thickness of 0.3 to 3 μm, typically about 2 μm, which is considerably thin can be formed between the support base 531 and the cover material 533. The thickness of the thin film integrated circuit includes a thickness of each insulating film and an interlayer insulating film formed between the adhesives 530 and 532 as well as a thickness of the semiconductor element itself. Further, the thin film integrated circuit included in the semiconductor device can be formed so as to occupy an area of 5 mm square or less, or more preferably about 0.3 to 4 mm square.

By providing the thin film integrated circuit at a position close to the center between the support base 531 and the cover material 533, mechanical strength of the semiconductor device can be enhanced. In specific, provided that a distance between the support base 531 and the cover material 533 is d, it is preferable to control the thickness of the adhesives 530 and 532 so that a distance x between the support base 531 and the center in a direction of the thickness of the thin film integrated circuit satisfies the following formula 1.

$$\frac{1}{2}d - 30 \ \mu m < x < \frac{1}{2}d + 30 \ \mu m \quad \text{[Formula 1]}$$

In this embodiment, an example of using W as the metal film 516 is described, however, the invention is not limited to this material. The metal film 516 may be formed of a material containing a metal on which the metal oxide film 518 is formed and which is capable of partially peeling the semiconductor device off on the border of the metal oxide film 518. For example, TiN, WN, Mo and the like as well as W can be used. In the case of using an alloy of these metals including W for the metal film, an optimal temperature in the heat treatment for crystallizing the metal oxide film 518 varies depending on the composition ratio thereof. Therefore, by controlling the composition ration, the heat treatment can be performed at a temperature which does not bother the manufacturing steps of the semiconductor element, thus the selection of the process for manufacturing the semiconductor element is unlikely to be restricted.

In addition to the aforementioned steps, treatment for partially lowering the adhesion property between the metal oxide film 518 and the oxide film 517, or between the metal oxide film 518 and the metal film 516 to form a portion as a beginning for starting the peeling. In specific, a portion in or adjacent to the interface of the metal oxide film 518 is damaged by locally applying a pressure from outside along a peripheral edge of a region to be peeled off. For example, a solid needle such as a diamond pen is pressed near an edge portion of the metal oxide film 518 and moved along the metal oxide film 518 with the pressure being applied. Preferably, a scriber device is moved with pressure with an indentation of 0.1 to 2 mm. In this manner, by forming a portion of which adhesion property is lowered as a beginning for starting the peeling, the semiconductor device can be reliably peeled off in a portion of the metal oxide film 518.

Even when an IC card before storing data in a ROM thereof is illegally obtained by a third person by stealing and the like, engraving a serial number on a semiconductor film, an insulating film and the like used for the semiconductor device makes it possible to track the route of circulation thereof to some extent. In this case, it is more efficient to engrave a serial number at a place where the serial number cannot be erased unless the semiconductor device is decomposed until no good.

Figure 8A:
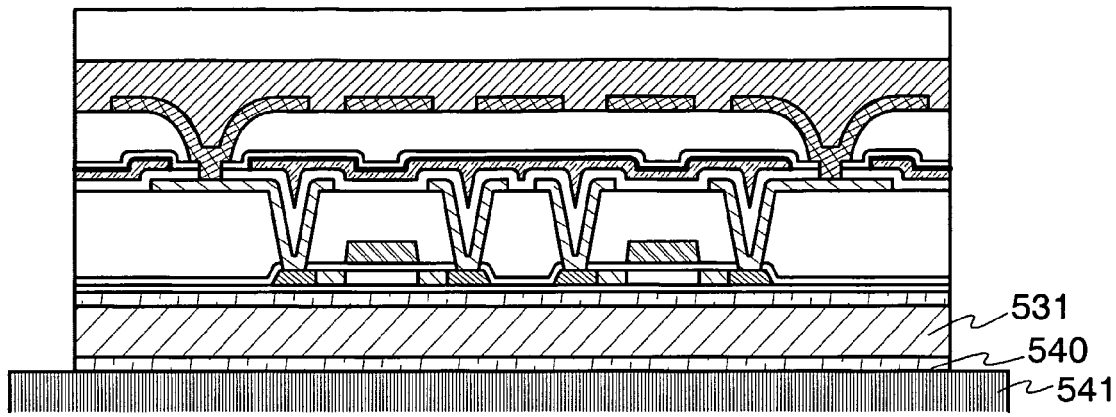
FIG. 8A is a sectional view of the ID tag of the invention stuck to an object and FIG. 8B is a sectional view of the ID tag of the invention being peeled off the object.

Next, as shown in FIG. 8A, for example, an object 541 is stuck to the support base 531 of the semiconductor device shown in FIG. 7 by using an adhesive 540. At this time, for the adhesive 540, a material which has enough strength is used so that the support base 531 and the object 541 are not peeled off when peeling a semiconductor device off after adhesion to the object 541, although the semiconductor device may be peeled off in the metal oxide film 518. For the adhesive 540, for example, various curable adhesives such as a photo-curable adhesive such as a reactive curable adhesive, a heat curable adhesive, and an ultraviolet curable adhesive, and an anaerobic adhesive can be used.

Figure 8B:
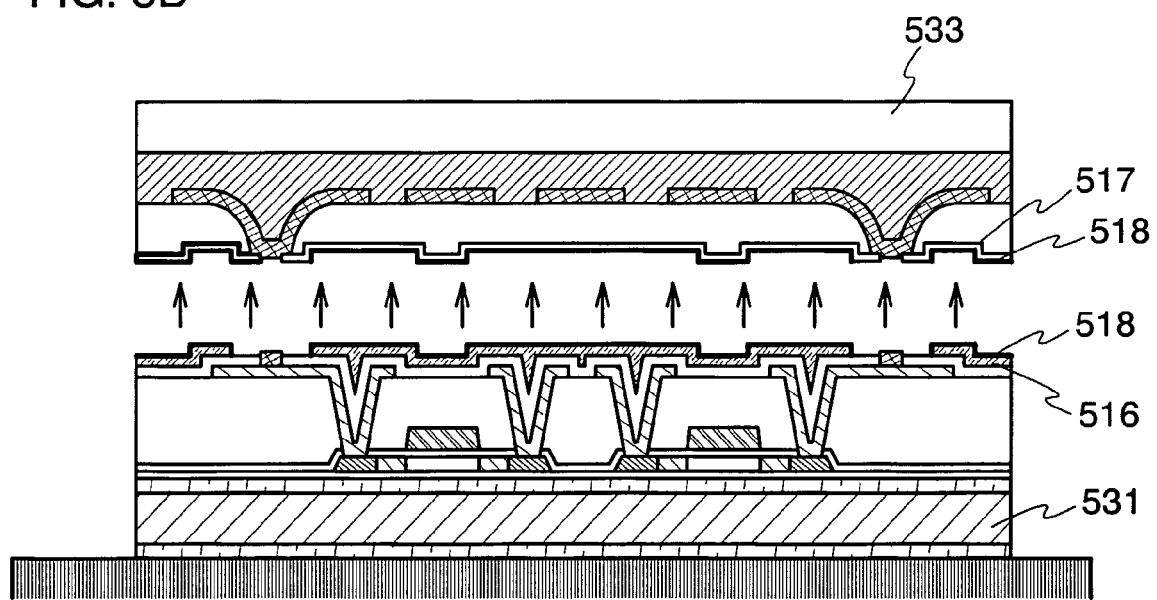

Next, as shown in FIG. 8B, the metal oxide film 518 is separated when a force is applied for peeling off the semiconductor device, thereby the semiconductor device is partially peeled off. In specific, by this peeling, a portion separated between the metal film 516 and the metal oxide film 518, a portion separated between the oxide film 517 and the metal oxide film 518, and a portion where the metal oxide film 518 itself is separated in both ways are generated. The separation is conducted so that the semiconductor element (TFTs 505 and 506 here) adheres to the support base 531 side while the antenna 519 adheres to the cover material 533 side. The antenna 519 is not necessarily separated onto the cover material 533 side completely, but a portion thereof only may be separated onto the support base 531 as well. By this peeling, the antenna 519 and the TFTs 505 and 506 are electrically separated, thus transmission/reception of signals or a power source voltage between the ID tag and the reader/writer can be reliably restricted.

In this embodiment mode, the metal oxide film 518 is formed between the antenna and the TFTs 505 and 506 included in the thin film integrated circuit, however, the invention is not limited to this structure. It is required that a wiring which forms the antenna 519 a wiring for electrically connecting semiconductor elements which form the thin film integrated circuit, or a wiring for electrically connecting the antenna 519 and the thin film integrated circuit is formed so as to pass through the metal oxide film 518.

The thin film integrated circuit may be peeled off the substrate 500 by various methods as well as a method for etching a silicon film as described in this embodiment. For example, the thin film integrated circuit can be peeled off the substrate by breaking the peeling layer by irradiating laser light. Alternatively, the thin film integrated circuit can be peeled off the substrate by removing the substrate on which the thin film integrated circuit or mechanically by etching using solution or gas.

Note that the TFTs 505 and 506 may be covered with a silicon nitride film or a silicon nitride oxide film before being covered with the first interlayer insulating film 510. According to the aforementioned structure, the TFTs 505 and 506 are covered with a base film 502 and the silicon nitride film or the silicon nitride oxide film, therefore, it can be prevented that an alkaline metal such as Na or an alkaline earth metal is dispersed in a semiconductor film used for the semiconductor element and adversely affects the characteristics of the semiconductor element.

In the case of using organic resin for the adhesive 530 which is in contact with the base film 502 in order to obtain the flexibility of the semiconductor device, it can be prevented that an alkaline metal such as Na or an alkaline earth metal is dispersed in a semiconductor film by using a silicon nitride film or a silicon nitride oxide film for the base film 502.

In the case where a surface of the object is curved and thereby the support base of the semiconductor device stuck to the curved surface is curved so as to have a curved surface along a generating line of a conical surface, a columnar surface and the like, it is preferable to make a direction of the generating line and a moving direction of carriers of the TFT be the same. According to the aforementioned structure, it can be suppressed that the characteristics of the TFT are affected when the support base is curved. Moreover, by setting a ratio of an area which is occupied by an island-shaped semiconductor film in the thin film integrated circuit to be 5 to 30%, it can further be suppressed that the characteristics of the TFT are affected when the support base is curved.

Embodiment 1

Figure 9A:
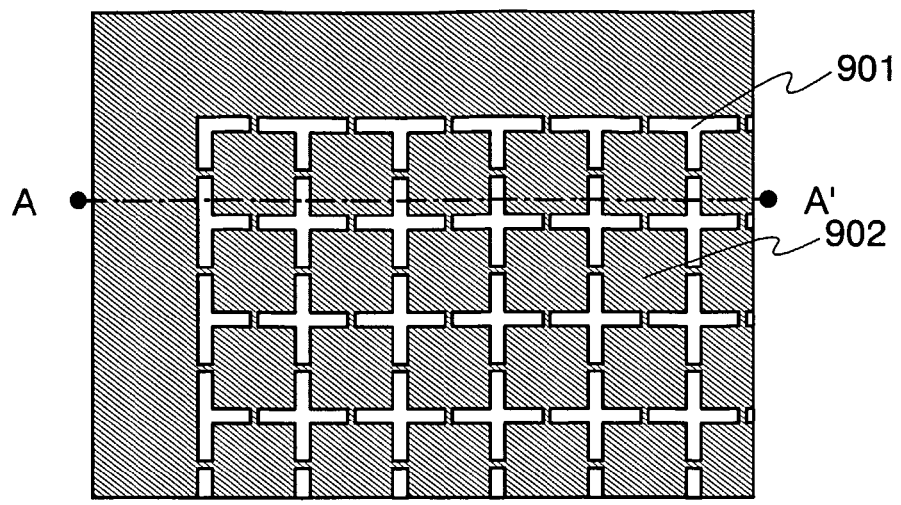
FIGS. 9A to 9D are top plan views and sectional views of a substrate 903 on which grooves 901 are formed.
Figure 9B:
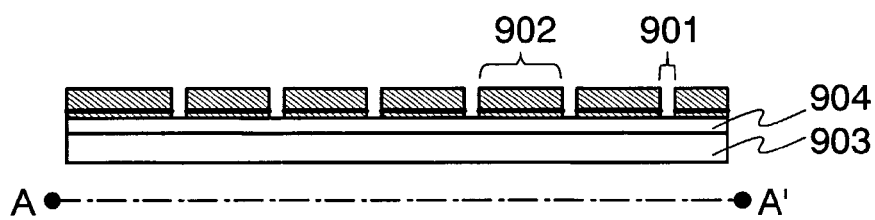

In this embodiment, the shape of a groove is described which is formed when peeling off a plurality of integrated circuits which are formed on one substrate. FIG. 9A is a top plan view of a substrate 903 on which a groove 901 are formed. FIG. 9B is a sectional view of FIG. 9A along A-A'.

Thin film integrated circuits 902 are formed on a peeling layer 904 which is formed on the substrate 903. The groove 901 is formed between each of the thin film integrated circuits 902 and formed deep enough to expose the peeling layer 904. In this embodiment, the plurality of thin film integrated circuit 902 are not completely but partially separated by the grooves 901.

Figure 9C:
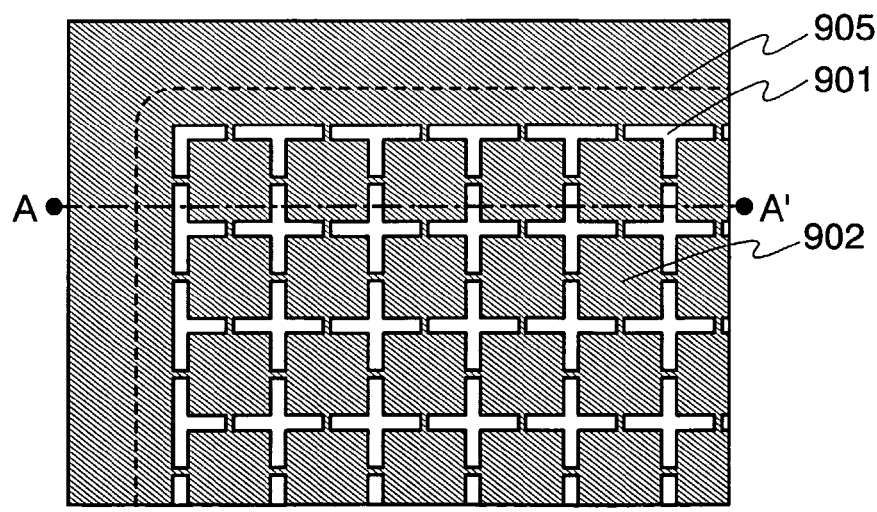
Figure 9D:
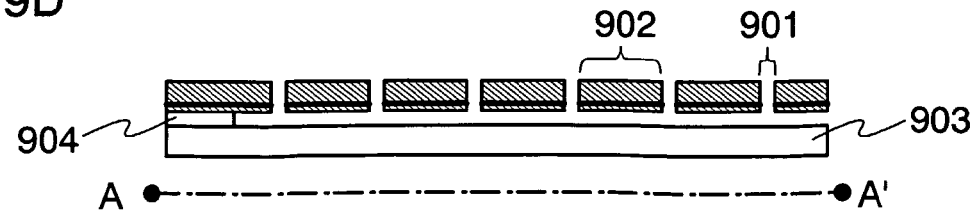

Next, FIGS. 9C and 9D show the substrates after flowing etching gas into the grooves 901 shown in FIGS. 9A and 9B to remove the peeling layer 904 by etching. FIG. 9C corresponds to a top plan view of the substrate 903 on which the grooves 901 are formed. FIG. 9D corresponds to a sectional view along A-A' of FIG. 9C. It is assumed that the peeling layer 904 is etched from the groove 901 to a region denoted by a broken line 905. The plurality of thin film integrated circuit 902 are not completely separated by the grooves 901 but are partially connected so that each of the thin film integrated circuit 902 does not move after losing the support of the peeling layer 904 after etching.

After the states shown in FIGS. 9C and 9D are formed, the thin film integrated circuits 902 are peeled off the substrate 903 by using a tape coated with an adhesive, a substrate and the like which are prepared separately. The plurality of thin film integrated circuits 902 which are peeled off are stuck to the support base before or after being separated from each other.

This embodiment describes an example of a manufacturing method of the semiconductor device. A manufacturing method of the semiconductor device is not limited to the structure described in this embodiment.

Embodiment 2

Next, one mode of a functional structure of the semiconductor device of the invention is described with reference to FIG. 10.

Reference numeral 300 denotes an antenna and 301 denotes a thin film integrated circuit. The antenna 300 includes an antenna coil 302 and a capacitor 303 formed in the antenna coil 302. The thin film integrated circuit 301 includes a demodulating circuit 309, a modulating circuit 304, a rectifying circuit 305, a micro processor 306, a memory 307, and a switch 308 for applying a load to the antenna 300. Note that a plurality of the memory 307 may be provided as well as one.

The signals transmitted as radio waves from a reader/writer are converted into alternating electronic signals through electromagnetic induction by the antenna coil 302. The demodulating circuit 309 demodulates the alternating electronic signals and transmits them to the subsequent micro processor 306. The rectifying circuit 305 generates a power source voltage by using the alternating electronic signals and supplies them to the subsequent micro processor 306.

The micro processor 306 performs various operations according to the inputted signals. The memory 307 which stores a program, data and the like used by the micro processor 306 can also be used as an area for the operations. The signals sent to the modulating circuit 304 from the micro processor 306 are modulated into an alternating electronic signals. The switch 308 can apply a load to the antenna coil 302 according to the alternating electronic signals from the modulating circuit 304. The reader/writer can read the signals from the micro processor 306 consequently by receiving the load applied to the antenna coil 302 as radio waves.

Figure 10:
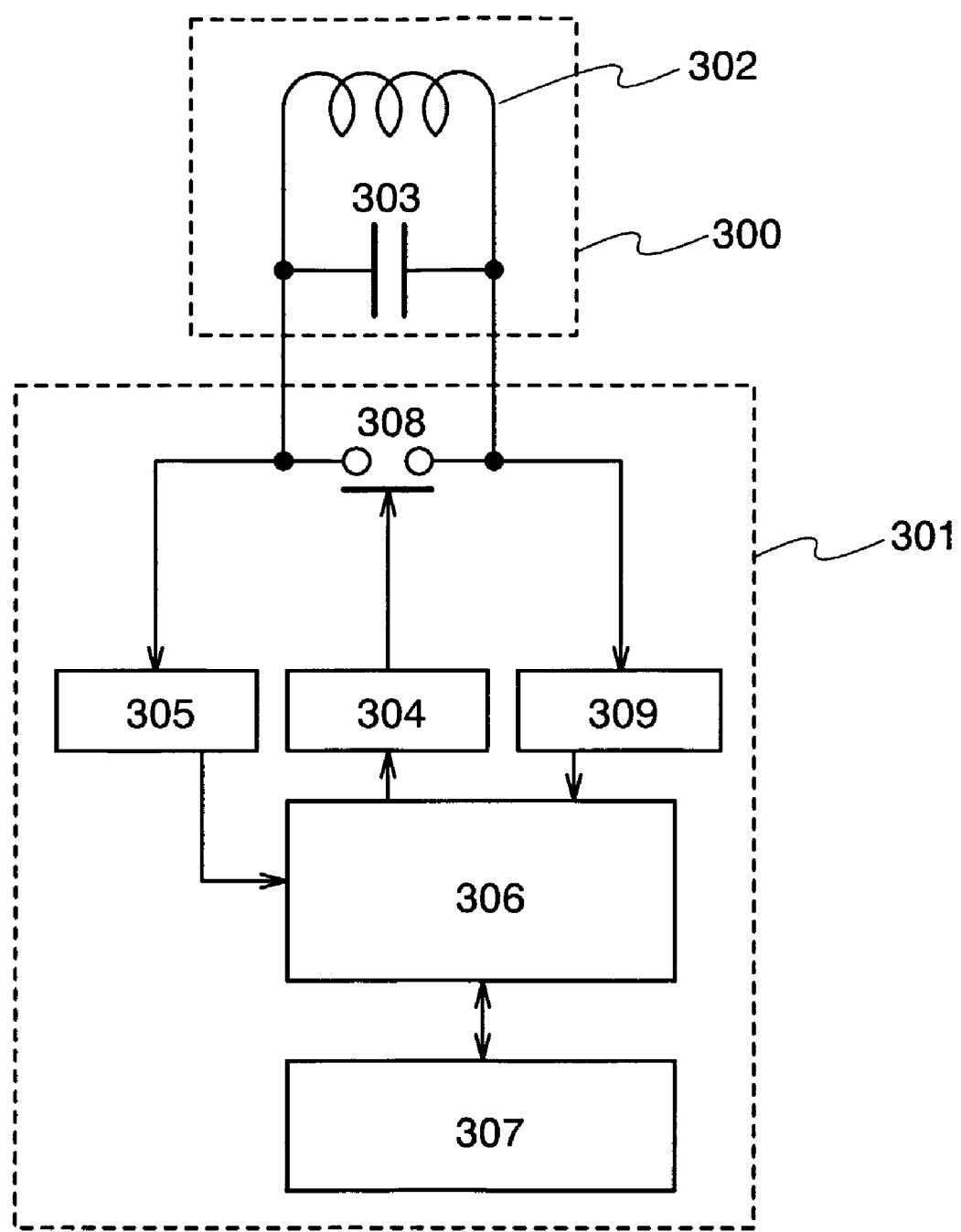
FIG. 10 is a diagram showing one mode of a functional structure of the ID tag of the invention.

The semiconductor device shown in FIG. 10 is only a mode of the invention and the invention is not limited to the aforementioned structure. The transmission of the signals is not limited to an electromagnetic coupling method shown in FIG. 10 but other transmission methods such as electromagnetic induction method or a microwave method can be used. In addition, a function such as a GPS may be incorporated as well.

Embodiment 3

Figure 11A:
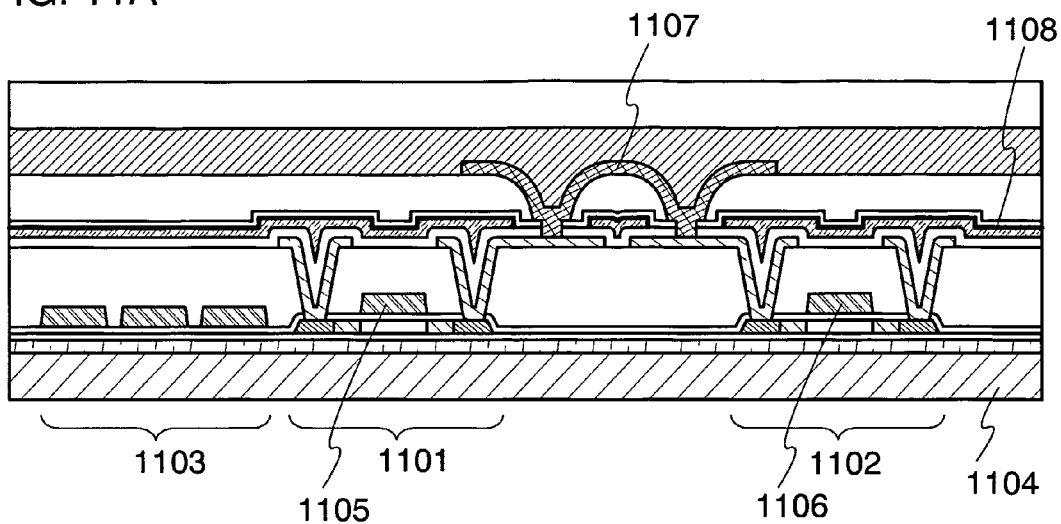
FIG. 11A is a sectional view of the ID tag of the invention and FIG. 11B is a sectional view of the ID tag being peeled off an object.

In this embodiment, an example of a semiconductor device is described in which a wiring for electrically connecting the semiconductor elements in the thin film integrated circuit passes through the separating layer. In FIG. 11A, TFTs 1101 and 1102 as one of the semiconductor elements in the thin film integrated circuit and an antenna 1103 are stuck to a support base 1104. In this embodiment, a top gate type TFT is used for the TFTs 1101 and 1102 as an example.

In FIG. 11A, a wiring which forms the antenna 1103, gate electrodes 1105 and 1106 of the TFTs 1101 and 1102 respectively are formed by patterning the same conductive film. The TFTs 1101 and 1102 are electrically connected by using a wiring 1107 which passes through a separating layer (a metal oxide film in this embodiment) 1108. In specific, the wiring 1107 and the wirings 1101 and 1111 connected to the TFTs 1110 and 1102 respectively are connected.

Figure 11B:
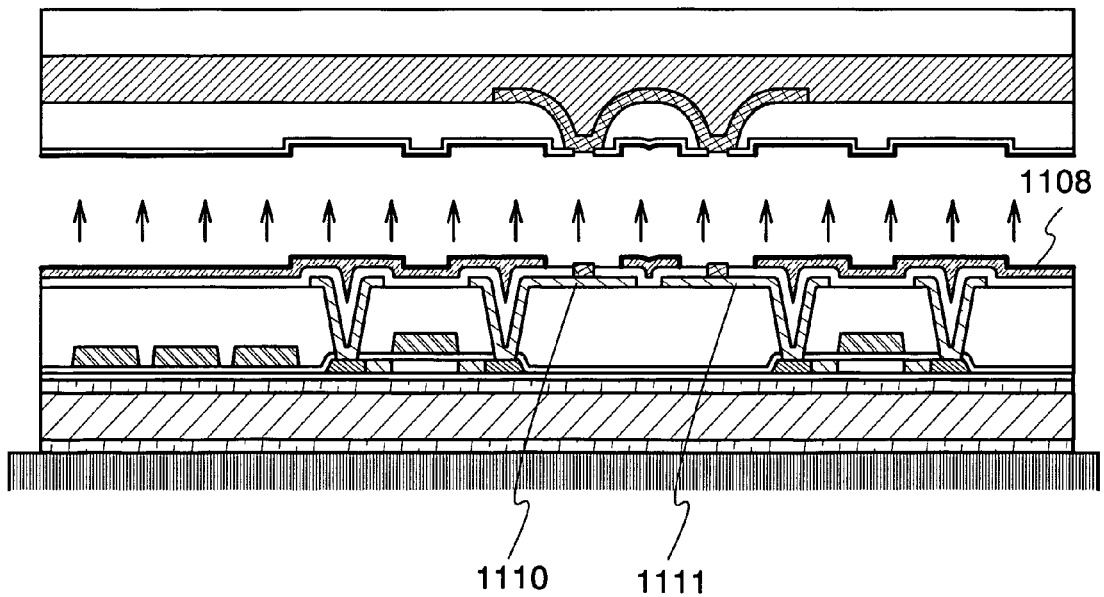

FIG. 11B shows the semiconductor device shown in FIG. 11A being peeled off after being stuck to an object. As shown in FIG. 11B, when the semiconductor device is torn off on the border of the metal oxide film 1108, the wiring 1107 which electrically connects the TFTs 1101 and 1102 is cut off, thus a function of the thin film integrated circuit can be broken.

FIG. 11B shows an example where the wiring 1107 is cut off by peeling a semiconductor device off, however, this embodiment is not limited to this. For example, the wiring 1107 may be separated from the wirings 1110 and 1111 by peeling the semiconductor device off.

In this embodiment, the wiring which forms the antenna 1103 and the gate electrodes 1105 and 1106 of the TFTs 1101 and 1102 are formed by patterning the same conductive film, however, the invention is not limited to this structure. For example, the antenna and the wirings 1110 and 1111 may be formed by patterning the same conductive film.

Embodiment 4

Figure 12A:
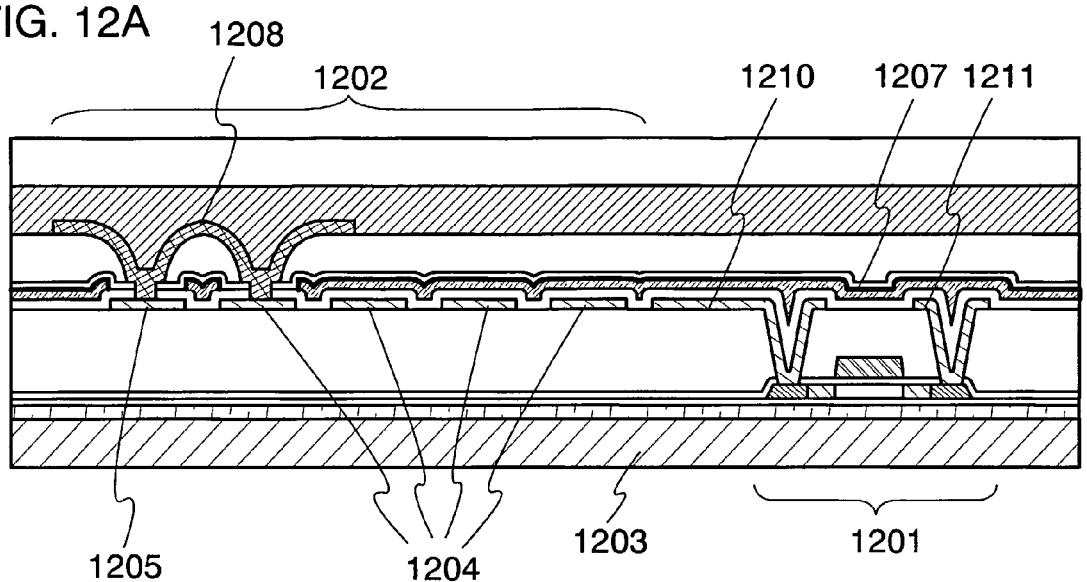
FIG. 12A is a sectional view of the ID tag of the invention and FIG. 12B is a sectional view of the ID tag being peeled off an object.

In this embodiment, an example of the semiconductor device in which a wiring which forms an antenna passes through a separating layer. In FIG. 12A, a TFT 1201 as one of the semiconductor elements in the thin film integrated circuit and an antenna 1202 are stuck to a support base 1203. In this embodiment, a top gate type TFT is used for the TFT 1201 as an example.

In FIG. 12A, wirings 1204 and 1205 which form the antenna 1202 and wirings 1210 and 1211 connected to the TFT 1201 are formed by patterning the same conductive film. The wiring 1204 and the wiring 1205 are electrically connected by using a wiring 1208 which passes through a separating layer (a metal oxide film in this embodiment) 1207. That is, the antenna 1202 includes the wirings 1204, 1208, and 1205 which are connected in series.

Figure 12B:
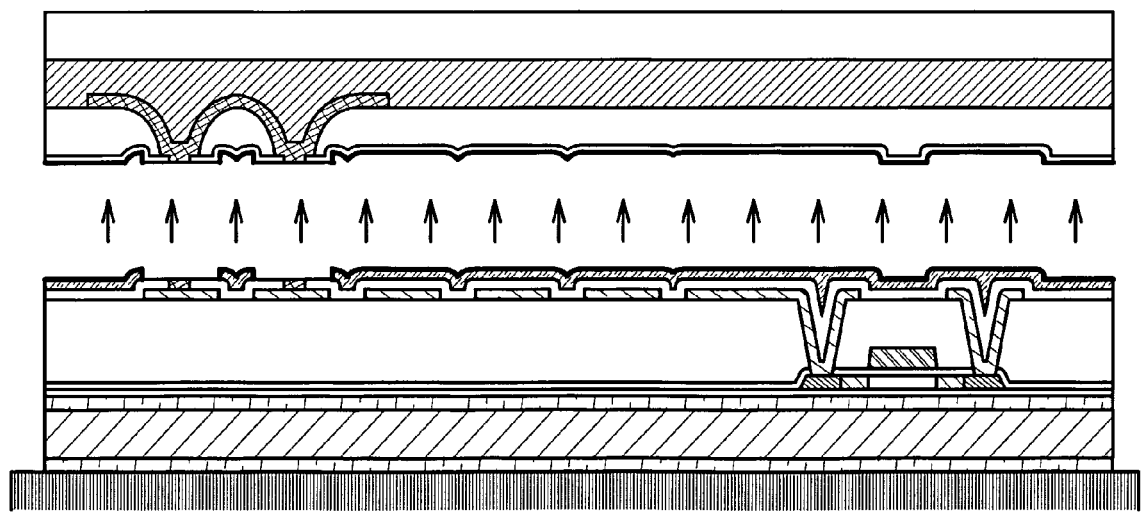

FIG. 12B shows the ID tag shown in FIG. 12A being peeled off after being stuck to an object. As shown in FIG. 12B, the wiring 1208 is cut off by the semiconductor device torn off on the border of the metal oxide film 1207. Therefore, as the wirings 1204 and 1205 which form the antenna are electrically cut off, a function of the antenna can be broken.

FIG. 12B shows an example where the wiring 1208 is cut off by peeling the semiconductor device off, however, this embodiment is not limited to this structure. For example, the wirings 1208 may be separated from the wirings 1204 and 1205 may be cut off by peeling off the semiconductor device.

In this embodiment, the wirings 1204 and 1205 which form the antenna 1202 and the wirings 1210 and 1211 connected to the TFT 1201 are formed by patterning the same conductive film, however, this embodiment is not limited to this structure. For example, the wirings 1204 and 1205 and a gate electrode of the TFT 1201 may be formed by patterning the same conductive film.

The invention claimed is:

1. A semiconductor device comprising:
a support base interposed between a pair of first adhesives;
a thin film integrated circuit, an antenna, and a separating layer over the pair of first adhesives;
a wiring electrically connecting the thin film integrated circuit and the antenna;
a second adhesive over the wiring; and
a cover material over the second adhesive,
wherein the wiring passes through the separating layer, and
wherein the pair of first adhesives has a higher adhesion than the separating layer.

2. A semiconductor device comprising:
a support base interposed between a pair of first adhesives;
a thin film integrated circuit, a separating layer, and an antenna sequentially laminated over the pair of first adhesives;
a wiring electrically connecting the thin film integrated circuit and the antenna;
a second adhesive over the wiring; and
a cover material over the second adhesive,
wherein the wiring passes through the separating layer, and
wherein the pair of first adhesives has a higher adhesion than the separating layer.

3. A semiconductor device comprising:
a support base interposed between a pair of first adhesives;
a thin film integrated circuit, an antenna, and a separating layer over the pair of first adhesives, wherein the thin film integrated circuit comprises a plurality of semiconductor elements;
a wiring electrically connecting the plurality of semiconductor elements;
a second adhesive over the wiring; and
a cover material over the second adhesive,
wherein the wiring passes through the separating layer, and
wherein the pair of first adhesives has a higher adhesion than the separating layer.

4. A semiconductor device according to any one of claims 1 to 3, wherein the antenna is formed by one of a printing method and a droplet discharging method.

5. A semiconductor device according to claim 3, wherein the plurality of semiconductor elements comprise thin film transistors, wherein each of the thin film transistors comprises a semiconductor film and a gate electrode with a gate insulating film interposed therebetween.

6. A semiconductor device according to claim 5, wherein the antenna and the gate electrode are formed by patterning a same conductive film.

7. A semiconductor device according to any one of claims 1 to 3, wherein the thin film integrated circuit and the antenna are formed over a substrate and then peeled off by removing the substrate, and stuck to the support base using one of the pair of first adhesives.

8. A semiconductor device comprising:
a support base interposed between a pair of first adhesives;
a thin film integrated circuit, an antenna, and a separating layer over the pair of first adhesives;
a second adhesive over the antenna; and
a cover material over the second adhesive,
wherein the antenna comprises a plurality of wirings connected in series, and wherein at least one of the plurality of wirings passes through the separating layer, and
wherein the pair of first adhesives has a higher adhesion than the separating layer.

9. A semiconductor device according to claim 8, wherein the thin film integrated circuit and the antenna are formed over a substrate and then peeled off the substrate by removing the substrate, and stuck to the support base using one of the pair of first adhesives.

10. A semiconductor device comprising:
a support base interposed between a pair of first adhesives;
a thin film integrated circuit, an antenna, and a separating layer sequentially laminated over the pair of first adhesives;
a second adhesive over the antenna; and
a cover material over the second adhesive,
wherein the antenna comprises a plurality of wirings connected in series,
wherein at least one of the plurality of wirings passes through the separating layer, and
wherein the pair of first adhesives has a higher adhesion than the separating layer.

11. A semiconductor device according to claim 10, wherein the thin film integrated circuit and the antenna are formed over a substrate and then peeled off the substrate by removing the substrate, and stuck to the support base using one of the pair of first adhesives.

12. A semiconductor device according to any one of claims 1 to 3, 8 and 10, wherein the separating layer comprises a metal oxide film containing at least one selected from the group consisting of TiN, WN, Mo and W.

13. A semiconductor device according to claim 12, wherein the metal oxide film is in a crystalline state.

14. A semiconductor device according to any one of claims 1 to 3, 8 and 10, wherein the support base comprises at least one of a plastic and a paper.

15. A semiconductor device according to any one of claims 1 to 3, 8 and 10, wherein the semiconductor device is stuck to an object selected from the group consisting of a container, an envelope, a check and a passport.

* * * * *